(12) United States Patent
Oberlander et al.

(10) Patent No.: US 6,368,421 B1
(45) Date of Patent: *Apr. 9, 2002

(54) COMPOSITION FOR STRIPPING PHOTORESIST AND ORGANIC MATERIALS FROM SUBSTRATE SURFACES

(75) Inventors: Joseph E. Oberlander, Phillipsburg, NJ (US); Mark S. Slezak, Sunnyvale, CA (US); Dinesh N. Khanna; Dana L. Durham, both of Flemington, NJ (US); Lawrence F. Spinicelli, Matthews, NC (US)

(73) Assignee: Clariant Finance (BVI) Limited (VG)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/113,892

(22) Filed: Jul. 10, 1998

(51) Int. Cl.$^7$ .............................. B08B 3/04; C11D 1/66; C11D 1/72; C11D 1/825
(52) U.S. Cl. .............................. 134/40; 134/38; 134/39; 510/175; 510/176; 510/365
(58) Field of Search .............................. 134/2, 3, 38, 39, 134/40; 510/175, 176, 245, 364, 365

(56) References Cited

U.S. PATENT DOCUMENTS

| | | | |
|---|---|---|---|
| 4,395,479 A | 7/1983 | Hurley et al. | |
| 4,403,029 A | 9/1983 | Ward, Jr. et al. | 430/258 |
| 4,491,530 A | 1/1985 | Thomas | |
| H366 H | * 11/1987 | Seiders | |
| 4,770,713 A | 9/1988 | Ward | 134/38 |
| 4,824,763 A | 4/1989 | Lee | 430/258 |
| 4,853,315 A | 8/1989 | McKean et al. | 430/192 |
| 4,904,571 A | 2/1990 | Miyashita et al. | 430/331 |
| 4,944,893 A | 7/1990 | Tanaka et al. | 252/171 |
| 5,098,594 A | * 3/1992 | Doscher | |
| 5,185,235 A | 2/1993 | Sato et al. | 430/331 |
| 5,279,791 A | 1/1994 | Aldrich et al. | 422/58 |
| 5,308,745 A | 5/1994 | Schwartzkopf | 430/329 |
| 5,308,746 A | 5/1994 | Barnett et al. | |
| 5,334,332 A | 8/1994 | Lee | 252/548 |
| 5,419,779 A | 5/1995 | Ward | 134/38 |
| 5,482,566 A | 1/1996 | Lee | 134/42 |
| 5,501,936 A | 3/1996 | Hosoda et al. | 430/191 |
| 5,532,107 A | 7/1996 | Oie et al. | 430/192 |
| 5,541,033 A | 7/1996 | Blakeney et al. | 430/192 |
| 5,545,353 A | 8/1996 | Honda et al. | 510/176 |
| 5,554,312 A | 9/1996 | Ward | 510/175 |
| 5,563,119 A | 10/1996 | Ward | 510/176 |
| 5,597,678 A | 1/1997 | Honda et al. | |
| 5,612,303 A | * 3/1997 | Takayanagi et al. | 510/174 |
| 5,733,948 A | * 3/1998 | Nelson | |

FOREIGN PATENT DOCUMENTS

| | | |
|---|---|---|
| CH | 670 832 | 7/1989 |
| EP | 0 119 337 | 9/1984 |
| EP | 0 126 241 | 11/1984 |
| EP | 0 177 905 | 4/1986 |
| JP | 07064297 | 3/1995 |

OTHER PUBLICATIONS

JPO abstract of JP 09–169,998; Jun. 1997.*
Derwent abstract of JP 63–316,457; Jul. 1988.*
"Influence of Polymer Properties on Airborne Chemical Contamination of Chemically Amplified Resists", W. D. Hinsberg et al, SPIE vol. 1925, pp. 43–52.
JP 6167813, "Organic Resist Removing Compsn. with Anti –Corrosion Effect . . . ", Tokyo Ohka Kogyo Co. Ltd., Abstract.

* cited by examiner

*Primary Examiner*—Alexander Markoff
(74) *Attorney, Agent, or Firm*—Sangya Jain

(57) ABSTRACT

The invention relates to the field of microelectronics, such as integrated circuits, and more particularly to compositions and methods of removing photoresists or other organic materials from the surfaces of substrates used in the fabrication of integrated circuits. In particular the present invention relates to amine-free stripping compositions comprising solvent and surfactant that can effectively remove organic materials without corroding the underlying substrate, and the invention also relates to methods for removing these organic materials with the novel stripping composition.

10 Claims, No Drawings

COMPOSITION FOR STRIPPING PHOTORESIST AND ORGANIC MATERIALS FROM SUBSTRATE SURFACES

BACKGROUND OF INVENTION

The present invention relates to the field of microelectronics, such as integrated circuits, and more particularly to compositions and methods of removing photoresists or other organic materials from the surfaces of substrates used in the fabrication of integrated circuits. In particular the present invention relates to amine-free stripping compositions comprising solvent and surfactant that can effectively remove photoresist layers or organic materials without corroding the underlying substrate, and methods for removing these materials layers with the novel stripping composition.

Photoresist compositions ate used in microlithography processes for making miniaturized electronic components such as in the fabrication of computer chips and integrated circuits. Generally, in these processes, a thin coating of film of a photoresist composition is first applied to a substrate material used for making integrated circuits, where the substrate may be silicon wafers, or silicon wafers with a silicon oxide or a metallic coating. The coated substrate is then baked to evaporate any solvent in the photoresist composition and to fix the coating onto the substrate. The baked coated surface of the substrate is next subjected to an image-wise exposure to radiation.

This radiation exposure causes a chemical transformation in the exposed areas of the coated surface. Visible light, ultraviolet (UV) light, electron beam and X-ray radiant energy are radiation types commonly used today in microlithographic processes. After this image-wise exposure, the coated substrate is treated with a developer solution to dissolve and remove either the radiation-exposed or the unexposed areas of the photoresist. Subsequent processing then can be carried out on the substrate, which may include metal deposition, etching of the substrate, doping of the substrate or other processes known in the art. Once this processing is complete the photoresist is removed from the substrate. Traditionally, the photoresist layer is removed by wet chemical processing that attacks the photoresist and strips it from the substrate without corroding or destroying the integrity of the substrate surface.

There are two types of photoresist compositions, negative-working and positive-working. When negative-working photoresist compositions are exposed image-wise to radiation, the areas of the resist composition exposed to the radiation become less soluble to a developer solution (e.g. a cross-linking reaction occurs) while the unexposed areas of the photoresist coating remain relatively soluble to such a solution. Thus, treatment of an exposed negative-working resist with a developer causes removal of the non-exposed areas, of the photoresist coating and the creation of a negative image in the coating, thereby uncovering a desired portion of the underlying substrate surface on which the photoresist composition was deposited.

On the other hand, when positive-working photoresist compositions are exposed image-wise to radiation, those areas of the photoresist composition exposed to the radiation become more soluble to the developer solution (e.g. a rearrangement reaction occurs) while those areas not exposed remain relatively insoluble to the developer solution. Thus, treatment of an exposed positive-working photoresist with the developer causes removal of the exposed areas of the coating and the creation of a positive image in the photoresist coating. Again, a desired portion of the underlying substrate surface is uncovered.

Positive working photoresist compositions are currently favored over negative working resists because the former generally have better resolution capabilities and pattern transfer characteristics. Photoresist resolution is defined as the smallest feature which the resist composition can transfer from the photomask to the substrate with a high degree of image edge acuity after exposure and development.

Positive photoresists comprising alkali-soluble resins and photoactive compounds that are well-known in the art may be used, for example, as discussed in the following patents and incorporated herein by reference, U.S. Pat. No. 4,944,893, U.S. Pat. No. 4,853,315, U.S. Pat. No. 5,501,936, U.S. Pat. No. 5,532,107 and U.S. Pat. No. 5,541,033.

Stripping compositions known in the prior art contain compounds that make the composition difficult and expensive to handle in view of their toxicity, disposal, attack on the substrate, limited bath life, contamination of the processing environment, etc. Traditionally acidic strippers such as those disclosed in U.S. Pat. No. 4,944,893 were used to remove photoresists from silicon or silicon oxide surfaces, but these strippers cannot be used for substrates with metallic coating since acids attack these coatings. Organic strippers containing phenolics and hydrocarbon solvents are described in JP 6,167,813, and can be used for metal substrates but are not desirable due to the high toxicity and disposable cost of the hydrocarbon solvent. Strippers containing chromium trioxide and sulfuric acid also present a disposal difficulty associated with chromium. Stripping compositions containing basic compounds such as amines, alkanolamines, amides or tetramethyl ammonium hydroxide are known and are incorporated herein by reference, U.S. Pat. No. 4,770,713, U.S. Pat. No. 4,824,763, U.S. Pat. No. 4,904,571, U.S. Pat. No. 5,185,235, U.S. Pat. No. 5,279,791, and U.S. Pat. No. 5,545,353. Strippers containing only solvent to remove hard-baked photoresist are known, where the solvent is acetone or N methyl pyrollidone (NMP). Acetone presents a fire hazard and its use is discouraged. NMP strippers or those strippers containing basic compounds, such as amines, ethanolamines, amides or tetramethyl ammonium hydroxide were believed to be essential to effectively remove baked photoresists. However basic components are undesirable in environments where the photoresist is sensitive to environmental contamination, causing neutralization of the acid generated during photolysis and thereby effecting the characteristics of the photoresist. The contamination issue is made worse by the fact that most of these strippers need to be heated to temperatures of around 90° C. for effective stripping of the photoresist, leading to increased evaporation of the stripper components. Chemically amplified photoresists, for example, such as those developed for deep uv exposure are particularly sensitive to basic contamination as disclosed in the publication "Influence of polymer properties in airborne chemical contamination of chemically amplified resists," W. D. Hinsberg et al, SPIE Vol. 1925, 43–52. Thus there is a demand for effective strippers that are free of acidic and basic components or where such components can be generated.

Therefore a great need has developed for stripper compositions for photoresists, where the stripper compositions are non-corrosive to metallic substrates, are easily disposed of, are of low toxicity, contain no volatile components that are lost on heating and thus reducing the bath life of the stripper, can work with minimal or no heating, are cost effective and preferably contain no basic compounds that can lead to contamination of the photoresists being processed in the fabrication laboratories.

The objective of the present invention is to provide stripper compositions that exhibits substantially little human or environmental toxicity, are water miscible and are biodegradable. It is also the objective of the present invention to provide a stripping composition that is essentially, non-flammable, non-corrosive to metals, has low or no loss of the components during evaporation, and is effective with minimal or no heating. Another object of the present invention is to provide stripper compositions that are free of basic components, such as amines, ammonium hydroxide and hydroxylamines. Yet another objective of the present invention is to provide a stripper that can remove crosslinked photoresist or hardened photoresist without causing corrosion of the metallic substrate.

SUMMARY OF THE INVENTION

The novel stripping composition of the present invention comprises an admixture of a water miscible solvent and surfactant, where the composition is free of amines and does not corrode metallic surfaces. In a prefered embodiment of the invention the stripping composition further comprises additives that can enhance the performance of the composition for the removal of specific organic materials from specific substrates. Particularly preferred additives are tetrahydrothiophene 1,1-dioxide and polar protic solvents and mixtures thereof.

DETAILED DESCRIPTION OF THE INVENTION

The present invention discloses a non-corrosive stripper for photoresists and organic residues comprising an organic solvent composition and surfactant. The organic solvent should be miscible with water, preferably have a flash point greater than about 37° C., be a polar solvent, preferably have a boiling point greater than 60° C., and be nitrogen-free. Examples of such solvents, but not limited to, are ethers, acetates, lactones, sulfoxides, sulfones, carbonates or mixtures thereof. Ethers, such as glycolalkyl ethers are prefered, for example tripropyleneglycolmethylether (TPGME), dipropyleneglycolmethylether (DPGME) and propyleneglycolmethylether (PGME). Lactones, such as butyrolactone (BLO) are also preferred. Solvents that do not react or decompose at temperatures to which the stripper might be heated, such as 90° C., are also preferred; DPGME, TGME, PGME, BLO, dimethylsulfoxide (DMSO) and mixtures thereof are examples of such preferred solvents.

The surfactant in the novel stripper aids in the efficient removal of the photoresist without corroding the metallic substrate, especially where the resist has been treated at high temperatures, such as crosslinking, ion implantation or hard baking at temperatures in excess of 140° C. The types of surfactants that are found to work well are those that are preferably low foaming, environmentally safe, preferably biodegradable, chemically stable, and soluble in aqueous solutions, especially where the stripper solution may be heated. Nonionic surfactants are particularly useful, although anionic and cationic surfactants may be used. Examples of nonionic surfactants are linear or branched alkoxylates, ethyleneoxidelpropyleneoxide polymers, acetylenic alcohols, polyethylene glycol monophenyl ether, etc. Specific examples of surfactants, but not limited to, are linear alcohol alkoxylates, tridecylalkoxylates, poly (ethyleneoxide co propyleneoxide) and polyethylene oxide. The stripper of the present invention may contain single or mixtures of these surfactants.

Optionally, it may be desirable to add other components to the novel stripper. Such additives could be antifoaming agents, polar protic solvents, sulfoxide containing compounds, sulfone containing compounds, amides, lactones, carbonates, salts or mixtures thereof. Although nonionic surfactants have reduced foaming capacity, in certain uses of the stripper it may be necessary to add antifoaming agents generally known to be suitable for the appropriate nonionic surfactant. Other protic solvents that may be incorporated into the stripper can be water, glycerine, glycols, low molecular weight ($C_1$–$C_6$) alcohols, etc. It was also found that the compounds containing sulfoxide or sulfone groups when added to the novel stripper can also assist in the effective removal of the photoresist from the substrate; such compounds being, for example, tetrahydrothiophene 1,1-dioxide(sulfolane), 2,5-dihydrothiophene 1,1-dioxide(3-sulfolene), butadiene sulfone, and butane sulfone. Amides, preferably heat stable amides, may also be added to the novel stripper, an example of which is N,N-die,thyl-3-methylbenzamide.

The novel stripper composition of this invention comprises an admixture of a solvent and a surfactant, where the amount of solvent ranges from about 50 weight % to about 99.9 weight % of the total composition, and the amount of surfactant ranges from about 0.1 weight % to about 30 weight % of the total composition. Preferably the amount of solvent ranges from about 55 weight % to about 90 weight % of the total composition, and the amount of surfactant ranges from about 1 weight % to about 20 weight % of the total composition. Varying the relative proportion of the surfactant in the stripper allows for the adjustment of the efficacy of the novel stripper in removing different types of photoresists or polymers, especially where the materials to be removed have been treated. Similarly, varying the additives and their concentrations in the novel stripper can allow for the tuning of the performance desired from the stripper. The amount of additives in the novel stripper can range from about 0.1 weight % to about 50 weight % of the total composition, depending on the function of the additive.

The novel stripping compositions of the present invention are effective in removing a wide range of positive photoresists, but are particularly effective in removing photoresists comprising novolak resins and naphthoquinone diazides, especially where the photoresist has been baked at temperatures exceeding 140° C. The novel stripping composition is also particularly desirable for removing any photoresists that are sensitive to the presence of amines in the processing environment, especially chemically amplified photoresists, for example, such as those used for deep uv exposure, that is 180–260 nm. The deep uv photoresists comprise capped alkali-soluble resins and photoactive compounds, such as onium salts. Amines are known to deactivate these deep uv photoresists. The stripping composition of the present invention is particularly desirable since it does not contain any basic compounds.

Furthermore, the stripper of the present invention is also effective in removing photosensitive and nonphotosensitive polyimide coatings and organic antireflective coatings from substrates, for example, such as those disclosed in U.S. Pat. No. 5,294,680 and U.S. Pat. No. 4,803,147. The stripper is also effective in removing residues deposited on the substrate after the dry etching process, where commercially available equipment is used to etch substrates or polymers using plasma or reactive ions.

Examples of substrates for which the novel stripper is especially useful since it is non corrosive to the substrates, are aluminum, nickel iron, indium phosphide, titanium/tungsten, aluminum/silicon, aluminum/silicon/copper, silicon, silicon oxide, silicon nitride, silicon oxinitride, tantalum, copper, metal stacks, polysilicon, ceramics, aluminum/copper mixtures; gallium arsenide and other such Group III/V compounds, plastic substrates, such as polycarbonate. Other substrates known in the art may also be used.

The invention also comprises a process of removing the organic material from the substrate using the stripping composition of the present invention. Photoresist solutions, antireflective coatings, polyimide films, etc, can be applied to a substrate by any conventional method used in the art, including dipping, spraying, whirling and spin coating. When spin coating, for example, the organic solution can be adjusted with respect to the percentage of solids content in order to provide coating of the desired thickness, given the type of spinning equipment utilized and the amount of time allowed for the spinning process. The coatings produced by the above described procedure are particularly suitable for application to silicon wafers that have been metallized, such as are utilized in the production of microprocessors and other miniaturized integrated circuit components. The substrate may also comprise various polymeric resins especially transparent polymers such as polyesters. The substrate may have an adhesion promoted layer of a suitable composition such as one containing hexa-alkyl disilazane.

Once the solution is coated onto the substrate, and the substrate is temperature treated at from about 80° C. to about 110° C. for from about 30 seconds to about 180 seconds on a hot plate or for from about 15 to about 40 minutes in a convection oven. This temperature treatment is selected in order to reduce the concentration of residual solvents in the coating while not causing substantial thermal degradation. In general one desires to minimize the concentration of solvents and thus this first temperature treatment is conducted until substantially all of the solvents have evaporated leaving a coating. In a preferred embodiment the temperature is conducted at from about 85° C. to about 95° C. The treatment is conducted until the rate of change of solvent removal becomes relatively insignificant. The temperature and time selection depends on the photoresist properties desired by the user as well as equipment used and commercially desired coating times. The coated substrate can then be exposed to actinic radiation, especially ultraviolet radiation, at a wavelength of from about 180 nm to about 450 nm, x-ray, electron beam, ion beam or laser radiation, in any desired pattern, produced by use of suitable masks, negatives, stencils, templates, etc.

The photoresist is then optionally subjected to a post exposure second baking or heat treatment either before or after development. The heating temperatures may range from about 90° C. to about 170° C., more preferably from about 110° C. to about 1 50° C. The heating may be conducted for from about 10 seconds to about 30 minutes, more preferably from about 45 seconds to about 90 seconds on a hot plate or about 10 to about 30 minutes by convection oven.

The exposed photoresist-coated substrates are developed to remove the imagewise exposed, non-image areas by spray developing using an alkaline developing solution. The solution is preferably agitated, for example, by nitrogen burst agitation. The substrates are allowed to remain in the developer until all, or substantially all, of the photoresist coating has dissolved from the exposed areas. Developers may include aqueous solutions of ammoniun or alkali metal hydroxides. One preferred hydroxide is tetramethyl ammonium hydroxide. A suitable developer is AZ® 300 MIF Developer (available commercially from the AZ® Electronic Materials, a division of Clariant Corporation, Somerville, N.J.). After removal of the coated wafers from the developing solution, one may conduct an optional post-development heat treatment or bake to increase the coating's adhesion and chemical photoresistance to etching solutions and other substances. The post-development heat treatment can comprise the oven baking of the coating and substrate below the coating's softening point. The industrial applications, particularly in the manufacture of microcircuitry units on silicon/silicon dioxide-type substrates, the developed substrates may be treated with a buffered, hydrofluoric acid base etching solution. Alternatively the substrate may be dry etched using a plasma or reactive ion etching. Other known techniques may be used for processing of the substrate, such as ion implantation or metal deposition.

Eventually the photoresist or organic residues left from processing must be removed from the substrate. Stripping solutions are used to remove and clean the substrate of organic residues and photoresist. The substrate with the organic residues that are to be removed are contacted with the stripping solution by, for example, immersion or spray, for a time and temperature sufficient to cause complete removal. Typically the stripping time can range from about 1–60 minutes, preferably 1–30 minutes and more preferably 1–15 minutes, and the stripping temperature can range from about 20° C. to about 150° C., preferably 20° C. to 100° C. The exact processing details are determined by the equipment, materials to be removed and processing environment. The novel non-corrossive stripping composition of this invention is particularly suitable for minimal heating of the stripping composition and also particularly desirable for amine-free environments.

The following specific examples will provide detailed illustrations of the methods of producing and utilizing the compositions of the present invention. These examples are not intended to limit or restrict the scope of the invention in any way and should not be construed as providing conditions, parameters or values which must be utilized exclusively in order to practice the present invention.

EXAMPLES

Plurafac®, Iconol® and Tetronic® are trademarks of BASF Corporation. 100 Cherry Hill Road, Parsippany, N.J. 07054 USA. Fluorad FC-171 and FC-135 were purchased from 3M Company, 3M Center Building 223, St. Paul, Minn. 55144 USA. Surfynol® is a trademark of Air Products and Chemical Co., 7201 Hamilton Boulevard, Allentown, Pa. 18195 USA. Emery 6706 was purchased from Henkel Corporation, 5051 Estecreek Drive, Cincinnati, Ohio 45232 USA. Noigen EP-120A was purchased from Dai-Ichi Kogyo Seiyaku Co., Ltd., 7F. Shin Kyoto Center Building, Karasuma Nishiiru, Shiokojidori, Shimogyo-ku, Kyoto, KYO 600, Japan.

Example 1

A formulation with Plurafac® B-26 linear alcohol alkoxylate surfactant (available commercially from BASF) (1 wt %), sulfolane (35 wt %), deionized (DI) water (4 wt %), and DPGME (60 wt %) was prepared. The solution was mixed and evaluated as follows.

Several wafers were coated with 2.5 microns of AZ® P4110 photoresist (available from AZ® Electronic Materials, Clariant Corporation, 70 Meister Avenue, Somerville, N.J. 08876 USA), patterned and hard baked at 140° C. Several more wafers were coated with 4 microns of AZ® P4330 photoresist (available from AZ® Electronic Materials, Clariant Corporation, 70 Meister Avenue, Somerville, N.J. 08876 USA), patterned and hard baked at 140° C., 150° C. or 160° C. for 30 minutes. The wafers were submerged either in the stripping formulation bath at room temperature or in the stripping formulation bath heated to 90° C., and gentle agitation was applied. The time was noted when the pattern was removed from the wafers.

The results are shown in Table 1.

Example 2

A formulation with Plurafac® RA-30 linear alcohol alkoxylate surfactant (available commercially from BASF) (1 wt %), sulfolane (35 wt %), DI water (4 wt %), and DPGME (60 wt %) was prepared. The solution was mixed and evaluated according to the procedure in Example 1.

The results are shown in Table 1.

Example 3

A formulation with Iconol® TDA-9 surfactant (1 wt %), sulfolane (35 wt %), DI water (4 wt %), and DPGME (60 wt %) was prepared. The solution was mixed and evaluated according to the procedure in Example 1.

The results are shown in Table 1.

Example 4

A formulation with Pluronico® L-92 surfactant (1 wt %), sulfolane (35 wt %), DI water (4 wt %), and DPGME (60 wt %) was prepared. The solution was mixed and evaluated according to the procedure in Example 1.

The results are shown in Table 1.

Example 5

A formulation with Plurafac® B-26 linear alcohol alkoxylate surfactant (available commercially from BASF) (1 wt %), sulfolane (35 wt %), glycerine (4 wt %), and DPGME (60 wt %) was prepared. The solution was mixed and evaluated according to the procedure in Example 1.

The results are shown in Table 1.

Example 6

A formulation with Plurafac® B-26 linear alcohol alkoxylate surfactant (available commercially from BASF) (0.1 wt %), sulfolane (36 wt %), DI water (8 wt %), and DPGME (56 wt %) was prepared. The solution was mixed and evaluated according to the procedure in Example 1.

The results are shown in Table 1.

Example 7

A formulation with Plurafac® B-26 linear alcohol alkoxylate surfactant (available commercially from BASF) (0.1 wt %), sulfolane (37 wt %), DI water (1 wt %), and DPGME (62 wt %) was prepared. The solution was mixed and evaluated according to the procedure in Example 1.

The results are shown in Table 1.

Example 8

A formulation with Plurafac® B-26 linear alcohol alkoxylate surfactant (available commercially from BASF) (2% wt %), sulfolane (33 wt %), DI water (8 wt %), and DPGME (57 wt %) was prepared. The solution was mixed and evaluated according to the procedure in Example 1.

The results are shown in Table 1.

Example 9

A formulation with Plurafac® B-26 linear alcohol alkoxylate surfactant (available commercially from BASF) (2% wt %), sulfolane (36 wt %), DI water (1 wt %), and DPGME (61 wt %) was prepared. The solution was mixed and evaluated according to the procedure in Example 1.

The results are shown in Table 1.

TABLE 1

| Stripper | Time to Clear @ Room Temp/ AZ® P4110 2.5 microns 140° C. HB (min:sec) | Time to Clear @ 90° C. AZ® P4330 4 microns 140° C. HB (min:sec) | Time to Clear @ 90° C. AZ® P4330 4 microns 150° C. HB (min:sec) | Time to Clear @ 90° C. AZ® P4330 4 microns 160° C. HB (min:sec) |
|---|---|---|---|---|
| Example 1 | 2:30 | 0:20 Pattern 90% clear. | After 15 min.: Pattern 60% clear. | After 15 min.: Pattern 100% visible. |
| Example 2 | 2:00 | 0:20 | After 15 min.: Pattern 70% clear. | After 15 min.: Pattern 100% visible. |
| Example 3 | 2:00 | 0:20 Pattern 90% clear. | After 15 min.: Pattern clear. | After 15 min.: Pattern 60% clear. |
| Example 4 | 2:00 | 0:20 | After 15 min.: Pattern clear. | After 15 min.: Pattern 100% visible. |
| Example 5 | 3:15 | 0:30 | Unexposed resist left. | Both unexposed and patterned resist still visible. |
| Example 6 | 2:00 | 0:30 | Unexposed resist left. | Both unexposed and patterned resist still visible. |
| Example 7 | 3:00 spots visible | | | |
| Example 8 | 1:45 | 0:30 | 10:30 Pattern visible. | Cleared at 15 min. Pattern visible. |
| Example 9 | 3:15 | | | |

HB is hard bake.

Example 10

A stripping formulation with Plurafac® B-26 linear alcohol alkoxylate surfactant (available commercially from BASF) (27 wt %), sulfolane (12wt %), DI water (4 wt %), and DPGME (57 wt %) was prepared. The solution was mixed and evaluated as follows.

Several wafers were coated with 2.5 microns of AZ® P4110 photoresist (available from AZ® Electronic Materials, Clariant Corporation, 70 Meister Avenue, Somerville, N.J. 08876 USA), patterned and hard baked at 140° C. or 150° C. Several more wafers were coated with 6 microns of AZ® P4620 photoresist (available from AZ® Electronic Materials, Clariant Corporation, 70 Meister Avenue, Somerville, N.J. 08876 USA), patterned and hard baked at 140° C. or 150° C. for 30 minutes. The wafers were submerged either in the stripping formulation bath at room temperature bath or in the stripping formulation bath heated to 90° C., and gentle agitation was applied. The time was noted when the pattern was removed from the wafers.

The results are shown in Table 2.

Example 11

A formulation with Plurafac® B-26 linear alcohol alkoxylate surfactant (available commercially from BASF) (14 wt %), sulfolane (24 wt %), DI water (4 wt %), and DPGME (58 wt %) was prepared. The solution was mixed and evaluated according to the procedure in Example 10.

The results are shown in Table 2.

Example 12

A formulation with Plurafac® B-26 linear alcohol alkoxylate surfactant (available commercially from BASF) (1 wt %), sulfolane (24 wt %), DI water (4 wt %), and DPGME (71 wt %) was prepared. The solution was mixed and evaluated according to the procedure in Example 10.

The results are shown in Table 2.

Example 13

A formulation with Plurafac® B-26 linear alcohol alkoxylate surfactant (available commercially from BASF) (1 wt %), sulfolane (12 wt %), DI water (4 wt %), and DPGME (83 wt %) was prepared. The solution was mixed and evaluated according to the procedure in Example 10.

The results are shown in Table 2.

Example 14

A formulation with Plurafac® B-26 linear alcohol alkoxylate surfactant (available commercially from BASF) (1 wt %), sulfolane (37 wt %), DI water (4 wt %), and DPGME (58 wt %) was prepared. The solution was mixed and evaluated according to the procedure in Example 10.

The results are shown in Table 2.

Example 15

A formulation with Plurafac® B-26 linear alcohol alkoxylate surfactant (available commercially from BASF) (14 wt %), sulfolane (11 wt %), DI water (4 wt %), and DPGME (71 wt %) was prepared. The solution was mixed and evaluated according to the procedure in Example 10.

The results are shown in Table 2.

Example 16

A formulation with Plurafac® B-26 linear alcohol alkoxylate surfactant (available commercially from BASF) (1 wt %), sulfolane (12 wt %), DI water (4 wt %), and DPGME (83 wt %) was prepared. The solution was mixed and evaluated according to the procedure in Example 10.

The results are shown in Table 2.

BASF) (8 wt %) and dipropyleneglycolmethylether (DPGME) (92 wt %) was prepared. The solution was mixed and evaluated as follows.

Two wafers were coated with 4 microns of AZ® P4110 photoresist (available from AZ® Electronic Materials, Clariant Corporation, 70 Meister Avenue, Somerville, N.J. 08876 USA), patterned and one wafer was hard baked for 30 minutes at 140° C. and another wafer was hard baked at 90° C. for one minute. The wafers were submerged in the stripping formulation bath at room temperature and gentle agitation was applied. The time was noted when the pattern was removed from the wafers.

A wafer was coated with 4 microns of AZ® P4110 photoresist (available from AZ® Electronic Materials, Clariant Corporation, 70 Meister Avenue, Somerville, N.J. 08876 USA), patterned and hard baked at 90° C. for one minute. The wafer was submerged in the stripping formulation bath at 60° C. and gentle agitation was applied. The time was noted when the pattern was removed from the wafers.

The results are shown in Table 3.

Example 18

A stripping formulation with dimethylsulfoxide (DMSO) (92 wt %) and tridecylalcohol ethoxylate (Iconol® TDA-9 surfactant available commercially from BASF) (8 wt %) was prepared. The solution was mixed and evaluated according to the procedure in Example 17.

The results are shown in Table 3.

Example 19

A stripping formulation with butyrolactone (BLO) (92 wt %) and tridecylalcohol ethoxylate (Iconol® TDA-9 surfactant available commercially from BASF) (8 wt %) was prepared. The solution was mixed and evaluated according to the procedure in Example 17.

The results are shown in Table 3.

Example 20

A stripping formulation with propyleneglycolmethylether (PGME) (92 wt %) and tridecylalcohol ethoxylate (Iconol® TDA-9 surfactant available commercially from BASF) (8 wt

TABLE 2

| Stripper | Time to Clear @ Room Temp AZ® P4110 2.5 microns 140° C. HB (min:sec) | Time to Clear @ 90° C. AZ® P4110 2.5 microns 140° C. HB (min:sec) | Time to Clear @ 90° C. AZ® P4110 2.5 microns 150° C. HB (min:sec) | Time to Clear @ Room Temp AZ® P4620 6 microns 150° C. HB (min:sec) | Time to Clear @ 90° C. AZ® P4620 6 micons 140° C. HB (min:sec) | Time to Clear @ 90° C. AZ® P4620 6 microns 150° C. HB (min:sec) |
|---|---|---|---|---|---|---|
| Example 10 | >15:00 15% not cleared | 0:45 | | | 3:30 | 4:00 |
| Example 11 | 4:50 4:15 4:05 | 0:40 | 0:30 | 15:00 not clear | 2:30 | 5:00 |
| Example 12 | 2:35 | | | | | |
| Example 13 | 2:50 | | | | | |
| Example 14 | 2:40 | 0:30 white haze | | | 15:00 white haze | 15:00 Both haze and resist visible. |
| Example 15 | 6:45 | 0:20 | | | 3:30 | |
| Example 16 | 2:45 | | | | | |

HB is hardbake

Example 17

A stripping formulation with tridecylalcohol ethoxylate (Iconol® TDA-9 surfactant available commercially from %) was prepared. The solution was mixed and evaluated according to the procedure in Example 17.

The results are shown in Table 3.

Example 21

A stripping formulation with tripropyleneglycolmethylether (TPGME) (92 wt %) and tridecylalcohol ethoxylate (Iconol® TDA-9 surfactant available commercially from BASF) (8 wt %) was prepared. The solution was mixed and evaluated according to the procedure in Example 17.

The results are shown in Table 3.

TABLE 3

| Example | Clearing time for stripper at RT and hard bake at 90° C. for 1 min. (seconds) | Clearing time for stripper at 60° C. and hard bake at 90° C. for 1 min. (seconds) | Clearing time for stripper at RT and hard bake at 140° C. for 30 min. (seconds) |
| --- | --- | --- | --- |
| 17 | 180 | 60 | 90 |
| 18 | 90 | 45 | 90 |
| 19 | 30 | 20 | 30 |
| 20 | 60 | 30 | 60 |
| 21 | 330 | 60 | 600+ |

RT is room temperature.

Example 22

A stripping formulation with tridecylalcohol ethoxylate (Iconol® TDA-9 surfactant available commercially from BASF) (8 wt %), tetrahydrothiophene 1,1-dioxide (sulfolane) (34 wt %) and DPGME (58 wt %) was prepared. The solution was mixed and evaluated as follows.

Two wafers were coated with 4 microns of AZ® P4110 photoresist (available from AZ® Electronic Materials, Clariant Corporation, 70 Meister Avenue, Somerville, N.J. 08876 USA), patterned and one wafer was hard baked for 30 minutes at 140° C. and another wafer was hard baked at 90° C. for one minutes. The wafers were submerged in the stripping formulation bath at room temperature and gentle agitation was applied. The time was noted when the pattern was removed from the wafers.

The results are shown in Table 4.

Example 23

A stripping formulation with tridecylalcohol ethoxylate (Iconol® TDA-9 surfactant available commercially from BASF) (8 wt %), TPGME (58 wt %) and sulfolane (34 wt %) was prepared. The solution was mixed and evaluated according to the procedure in Example 22.

The results are shown in Table 4.

Example 24

A stripping formulation with DMSO (58 wt %), sulfolane (34 wt %) and tridecylalcohol ethoxylate (Iconol® TDA-9 surfactant available commercially from BASF) (8 wt %) was prepared. The solution was mixed and evaluated according to the procedure in Example 22.

The results are shown are Table 4.

Example 25

A stripping formulation with BLO (58 wt %), DPGME (34 wt %) and tridecylalcohol ethoxylate (Iconol® TDA-9 surfactant available commercially from BASF) (8 wt %) was prepared. The solution was mixed and evaluated according to the procedure in Example 22.

The results are shown in Table 4.

Example 26

A stripping formulation with PGME (58 wt %), sulfolane (34 wt %) and tridecylalcohol ethoxylate (Iconol® TDA-9 surfactant available commercially from BASF) (8 wt %) was prepared. The solution was mixed and evaluated according to the procedure in Example 22.

The results are shown in Table 4.

Example 27

A stripping formulation with DPGME (58 wt %), butadiene sulfone (34 wt %) and tridecylalcohol ethoxylate (Iconol® TDA-9 surfactant available commercially from BASF) (8 wt %) was prepared. The solution was mixed and evaluated according to the procedure in Example 22.

The results are shown in Table 4.

Example 28

A stripping formulation with DPGME (58 wt %), tetramethylene sulfoxide (34 wt %) and tridecylalcohol ethoxylate (Iconol® TDA-9 surfactant available commercially from BASF) (8 wt %) was prepared. The solution was mixed and evaluated according to the procedure in Example 22.

The results are shown in Table 4.

Example 29

A stripping formulation with DPGME (58 wt %), butane sulfolane (34 wt %) and tridecylalcohol ethoxylate (Iconol® TDA-9 surfactant available commercially from BASF) (8 wt %) was prepared. The solution was mixed and evaluated according to the procedure in Example 22.

The results are shown-in Table 4.

Example 30

A stripping formulation with dipropylene glycol monomethyl ether acetate (58 wt %), sulfolane (34 wt %) and tridecylalcohol ethoxylate (Iconol® TDA-9 surfactant available commercially from BASF) (8 wt %) was prepared. The solution was mixed and evaluated according to the procedure in Example 22.

The results are shown in Table 4.

Example 31

A stripping formulation with dipropylene glycol monobutyl ether (58 wt %), sulfolane (34 wt %) and tridecylalcohol ethoxylate (Iconol® TDA-9 surfactant available commercially from BASF) (8 wt %) was prepared. The solution was mixed and evaluated according to the procedure in Example 22.

The results are shown in Table 4.

Example 32

A stripping formulation with dipropylene glycol (58 wt %), sulfolane (34 wt %) and tridecylalcohol ethoxylate (Iconol® TDA-9 surfactant available commercially from BASF) (8 wt %) was prepared. The solution was mixed and evaluated according to the procedure in Example 22.

The results are shown in Table 4.

Example 33

A stripping formulation with diethyl carbonate (58 wt %), sulfolane (34 wt %) and tridecylalcohol ethoxylate (Iconol® TDA-9 surfactant available commercially from BASF) (8 wt %) was prepared. The solution was mixed and evaluated according to the procedure in Example 22.

The results are shown in Table 4.

Example 34

A stripping formulation with DPGME (58 wt %), sulfolane (34 wt %) and Emery 6706 surfactant (available commercially from Henkel Corporation) (8 wt %) was prepared. The solution was mixed and evaluated according to the procedure in Example 22.

The results are shown in Table 4.

Example 35

A stripping formulation with DPGME (58 wt %), sulfolane (34 wt %) and Noigen EP-120A surfactant (available commercially from Diaichi Kogyo Seiyaku) (8 wt %) was prepared. The solution was mixed and evaluated according to the procedure in Example 22.

The results are shown in Table 4.

Example 36

A stripping formulation with DPGME (58 wt %), sulfolane (34 wt %) and FC 171 surfactant (available commercially from 3M Corporation) (8 wt %) was prepared. The solution was mixed and evaluated according to the procedure in Example 22.

The results are shown in Table 4.

Example 37

A stripping formulation with DPGME (58 wt %), sulfolane (34 wt %) and Surfynol 440 surfactant (available commercially from Air Products and Chemical Co.) (8 wt %) was prepared. The solution was mixed and evaluated according to the procedure in Example 22.

The results are shown in Table 4.

Example 38

A stripping formulation with DPGME (58 wt %), sulfolane (34 wt %) and Tetronic 701 surfactant available commercially from BASF) (8 wt %) was prepared. The solution was mixed and evaluated according to the procedure in Example 22.

The results are shown in Table 4.

Example 39

A stripping formulation with DPGME (58 wt %), sulfolane (34 wt %) and FC 135 surfactant (available commercially from 3M Corporation) (8 wt %) was prepared. The solution was mixed and evaluated according to the procedure in Example 22.

The results are shown in Table 4.

Example 40

A stripping formulation with DPGME (58 wt %), sulfolane (34 wt %) and Iconol TDA 9 and Pluronic RA 30 surfactants (available commercially from BASF) (8 wt %) was prepared. The solution was mixed and evaluated according to the procedure in Example 22.

The results are shown in Table 4.

Example 41

A stripping formulation with DPGME (58 wt %), sulfolane (34 wt %) and polyethylene oxide surfactant (available commercially from Aldrich Co.) (8 wt %) was prepared. The solution was mixed and evaluated according to the procedure in Example 22.

The results are shown in Table 4.

Example 42(218)

A stripping formulation with DPGME (58 wt %), sulfolane (34 wt %) and ammonium lauryl sulfate surfactant (8 wt %) was prepared. The solution was mixed and evaluated according to the procedure in Example 22.

The results are shown in Table 4.

Example 43

A stripping formulation with DPGME (58 wt %), sulfolane (34 wt %) and Dowfax 2AO surfactant (available commercially from Dow Corporation) (8 wt %) was prepared. The solution was mixed and evaluated according to the procedure in Example 22.

The results are shown in Table 4.

TABLE 4

| Example | Clearing time for stripper at RT and hard bake at 90° C. for 1 min. (seconds) | Clearing time for stripper at RT and hard bake at 140° C. for 30 min. (seconds) |
| --- | --- | --- |
| 22 | 45 | 150 |
| 23 | 105 | 270 |
| 24 | 60 | 120 |
| 25 | 45, with spots on wafer | 124, with spots on wafer |
| 26 | 60, with spots on wafer | 70, with spots on wafer |
| 27 | 150 | 300 |
| 28 | 600+ | — |
| 29 | 600+ | 600+ |
| 30 | 600+ | |
| 31 | 400 | 600+ |
| 32 | 180 | 600+ |
| 33 | 600+ | — |
| 34 | 200 | 400 |
| 35 | 300 | 600+ |
| 36 | 120 | 120 |
| 37 | 600+ | — |
| 38 | 600+ | — |
| 39 | 90 | 600+ |
| 40 | 90 | 600+ |
| 41 | 90 | 600+ |
| 42 | 600+ | — |
| 43 | 540 | 600 |

Example 44

A stripping formulation with Plurafac® B-26 linear alcohol alkoxylate surfactant (available commercially from BASF) (8 wt %), sulfolane (17 wt %), and DPGME (75 wt %) was prepared. The solution was mixed and evaluated as follows.

A wafer was coated with 3 microns of AZ® P4210 photoresist (available from AZ® Electronic Materials, Clariant Corporation, 70 Meister Avenue, Somerville, N.J. 08876 USA), patterned and hard baked for 30 minutes at 140° C. The wafer was submerged in the stripping formulation bath at room temperature and gentle agitation was applied. The time was noted when the pattern was removed from the wafers.

The results are shown in Table 5.

The corrosion studies were run by heating the stripping formulation bath to 90° C. and submerging one wafer with a Ti/W surface and another wafer with a Al/Si/Cu surface half way in the bath. Afterwards the rinsed and dry wafers were evaluated by comparing the submerged and unsubmerged portion. The results showed no corrosion on either of the surfaces.

Example 45

A stripping formulation with Plurafac® B-26 linear alcohol alkoxylate surfactant (available commercially from BASF) (8 wt %), sulfolane (16 wt %), deionzied (DI) water (4 wt %), and DPGME (72 wt %). The solution was mixed and evaluated according to the procedure in Example 44.

The results are shown in Table 5.

The corrosion studies were run by heating the stripper bath to 90° C. and submerging one wafer with a Ti/W surface and another wafer with a Al/Si/Cu surface half way in the bath. Afterwards the rinsed and dry wafer was evaluated by comparing the submerged and unsubmerged portion. The results showed no corrosion on either of the surfaces.

Example 46

A stripping formulation with Plurafac® RA-30 linear alcohol alkoxylate surfactant (available commercially from BASF) (8 wt %), sulfolane (16 wt %), DI water (4 wt %), and DPGME (72 wt %) was prepared. The solution was mixed and evaluated according to the procedure in Example 44.

The results are shown in Table 5.

The corrosion studies were run by heating the stripper bath to 90° C. and submerging one wafer with a Ti/W surface and another wafer with a Al/Si/Cu surface half way in the bath. Afterwards the rinsed and dry wafer was evaluated by comparing the submerged and unsubmerged portion. The results showed no corrosion on either of the surfaces.

Example 47

A stripping formulation with tridecylalcohol ethoxylate (Iconol® TDA-9 surfactant available commercially from BASF) (8 wt %), sulfolane (16 wt %), DI water (4 wt %), and DPGME (72 wt %) was prepared. The solution was mixed and evaluated according to the procedure in Example 44.

The results are shown in Table 5.

The corrosion studies were run by heating the stripper bath to 90° C. and submerging one wafer with a Ti/W surface and another wafer with a Al/Si/Cu surface half way in the bath. Afterwards the rinsed and dry wafer was evaluated by comparing the submerged and unsubmerged portion. The results showed no corrosion on either of the surfaces.

Example 48

A stripping formulation with tridecylalcohol ethoxylate (Iconol® TDA-10 surfactant available commercially from BASF) (8 wt %), sulfolane (16 wt %), DI water (4 wt %), and DPGME (72 wt %) was prepared. The solution was mixed and evaluated according to the procedure in Example 44.

The results are shown in Table 5.

The corrosion studies were run by heating the stripper bath to 90° C. and submerging one wafer with a Ti/W surface and another wafer with a Al/Si/Cu surface half way in the bath. Afterwards the rinsed and dry wafer was evaluated by comparing the submerged and unsubmerged portion. The results showed no corrosion on either of the surfaces.

Example 49

A formulation with Pluronic® L-64 surfactant (available commercially from BASF) (8 wt %), sulfolane (16 wt %), DI water (4 wt %), and DPGME (72 wt %) was prepared. The solution was mixed and evaluated according to the procedure in Example 44.

The results are shown in Table 5.

The corrosion studies were run by heating the stripper bath to 90° C. and submerging one wafer with a Ti/W surface and another wafer with a Al/Si/Cu surface half way in the bath. Afterwards the rinsed and dry wafer was evaluated by comparing the submerged and unsubmerged portion. The results showed no corrosion on either of the surfaces.

Example 50

A formulation with Pluronic® L-92 surfactant (available commercially from BASF) (8 wt %), sulfolane (16 wt %), DI water (4 wt %), and DPGME (72 wt %) was prepared. The solution was mixed and evaluated according to the procedure in Example 44.

The results are shown in Table 5.

The corrosion studies were run by heating the stripper bath to 90° C. and submerging one wafer with a Ti/W surface and another wafer with a Al/Si/Cu surface half way in the bath. Afterwards the rinsed and dry wafer was evaluated by comparing the submerged and unsubmerged portion. The results showed no corrosion on either of the surfaces.

Example 51

A formulation with Plurafac® B-26 surfactant (available commercially from BASF) (8 wt %), sulfolane (16 wt %), glycerine (4 wt %), and DPGME (72 wt %) was prepared. The solution was mixed and evaluated according to the procedure in Example 44.

The results are shown in Table 5.

The corrosion studies were run by heating the stripper bath to 90° C. and submerging one wafer with a Ti/W surface and another wafer with a Al/Si/Cu surface half way in the bath. Afterwards the rinsed and dry wafer was evaluated by comparing the submerged and unsubmerged portion. The results showed no corrosion on either of the surfaces.

Example 52

A formulation with Plurafac® B-26 surfactant (available commercially from BASF) (8 wt %), sulfolane (16 wt %), propylene glycol (4 wt %), and DPGME (72 wt %) was prepared. The solution was mixed and evaluated according to the procedure in Example 44.

The results are shown in Table 5.

The corrosion studies were run by heating the stripper bath to 90° C. and submerging one wafer with a Ti/W surface and another wafer with a Al/Si/Cu surface half way in the bath. Afterwards the rinsed and dry wafer was evaluated by comparing the submerged and unsubmerged portion. The results showed no corrosion on either of the surfaces.

Example 53

A formulation with Plurafac® B-26 surfactant (available commercially from BASF) (7 wt %), sulfolane (15 wt %), DI water (4 wt %), N,N-diethyl-3-methylbenzamide (7 wt %) and DPGME (72 wt %) was prepared. The solution was mixed and evaluated according to the procedure in Example 44.

The results are shown in Table 5.

The corrosion studies were run by heating the stripper bath to 90° C. and submerging one wafer with a Ti/W surface and another wafer with a Al/Si/Cu surface half way in the bath. Afterwards the rinsed and dry wafer was evaluated by comparing the submerged and unsubmerged portion. The results showed no corrosion on either of the surfaces.

TABLE 5

| Example | Clearing time for stripper at RT and hard bake at 140° C. for 30 min. (minutes:seconds) |
|---|---|
| 44 | 6:50 |
| 45 | 3:05 |
| 46 | 3:00 |
| 47 | 3:00 |
| 48 | 3:30 |
| 49 | 2:45 |
| 50 | 3:00 |
| 51 | 8:00 |
| 52 | 7:05 |
| 53 | 5:05 |

What is claimed is:

1. An amine-free stripping composition especially useful for removing organic residues from a coated substrate used in the fabrication of integrated circuits consisting essentially of an admixture of one or more nonionic surfactants one or more glycol ethers, said one or more glycol ethers being different from said one or more nonionic surfactants, water and sulfolane.

2. The stripping composition according to claim 1, where the glycol ether is selected from tripropyleneglycolalkylether, dipropyleneglycolalkylether, propyleneglycolalkylether, or mixtures thereof.

3. The stripping composition according to claim 1, where the mixture of glycol ether and sulfolane is in the range from about 99.9 weight % to about 70 weight % of the total composition.

4. The stripping composition according to claim 1, where the nonionic surfactant is selected from alkoxylates, ethyleneoxide/propyleneoxide polymers, acetylenic alcohols, polyethylene glycol monophenyl ether or mixtures thereof.

5. The stripping composition according to claim 1, where the nonionic surfactant is in the range from about 0.1 weight % to about 30 weight % of the total composition.

6. The stripping composition according to claim 1, where the water is deionized water.

7. The stripper composition according to claim 1 where the substrate is selected from a group consisting of aluminum, nickel iron, indium phosphide, titanium/tungsten, aluminum/silicon, aluminum/silicon/copper, silicon, silicon oxide, silicon nitride, silicon oxinitride, tantalum, copper, metal stacks, polysilicon, ceramics, aluminum/copper mixtures and gallium arsenide.

8. The stripper composition according to claim 1 where the organic residue to be removed is selected from a group consisting of novolak resins, novolak/diazonaphthoquinone photoresists, chemically amplified photoresists, polyimides, polyimide/photoactive compound photoresists, organic anti-reflective coatings and dry etching residues.

9. A process of removing an organic residue from a coated substrate comprising contacting the organic residue with an effective amount of stripper composition from claim 1 for an effective period of time and temperature, and removing the residue from the substrate.

10. The stripping composition according to claim 1, wherein said glycol ether is dipropyleneglycolmethylether.

* * * * *